(12) United States Patent
Mei et al.

(10) Patent No.: US 6,475,895 B1
(45) Date of Patent: Nov. 5, 2002

(54) SEMICONDUCTOR DEVICE HAVING A PASSIVATION LAYER AND METHOD FOR ITS FABRICATION

(75) Inventors: Qi Mei, Irvine, CA (US); Umesh Sharma, Newport Beach, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/369,982

(22) Filed: Aug. 6, 1999

(51) Int. Cl.[7] ............................................... H01L 21/44
(52) U.S. Cl. ........................ 438/597; 438/680; 438/618; 257/701; 257/750
(58) Field of Search ................................ 438/597, 680, 438/613, 622, 624, 618; 257/750

(56) References Cited

U.S. PATENT DOCUMENTS

| | | | | |
|---|---|---|---|---|
| 5,858,870 A | * | 1/1999 | Zheng et al. | 438/622 |
| 5,925,932 A | * | 7/1999 | Tran et al. | 257/750 |
| 6,043,152 A | * | 3/2000 | Chang et al. | 438/680 |
| 6,097,090 A | * | 8/2000 | Tran et al. | 257/750 |
| 6,153,504 A | * | 11/2000 | Shields et al. | 438/613 |
| 6,174,800 B1 | * | 1/2001 | Jang | 438/629 |

* cited by examiner

*Primary Examiner*—John F. Niebling
*Assistant Examiner*—Olivia T Luk
(74) *Attorney, Agent, or Firm*—Farjami & Farjami LLP

(57) ABSTRACT

A semiconductor device structure and process for its fabrication includes a first layer of HDP oxide and an overlying layer of silicon oxynitride. Application of the HDP oxide to a pattern of metal structures fills gaps between the metal structures and allows for the void free deposition of the silicon oxynitride layer. The silicon oxynitride layer provides a hard outer coating to the passivation coating and is UV transparent so that, if necessary, non-volatile floating gate memory devices can be UV erased.

31 Claims, 2 Drawing Sheets

SEMICONDUCTOR DEVICE HAVING A PASSIVATION LAYER AND METHOD FOR ITS FABRICATION

BACKGROUND OF THE INVENTION

This invention relates generally to semiconductor devices and to a process for fabricating semiconductor devices. More specifically, this invention relates to semiconductor devices having a passivation layer and to a process for fabricating such devices.

One of the final steps in the fabrication of a semiconductor device at the wafer level is the application of a final passivation layer or coating. The final passivation layer of a semiconductor device serves as a protection layer which should be a good chemical barrier as well as a good mechanical barrier. The passivation layer protects the semiconductor device from being damaged during further handling, processing, and packaging. There are a number of properties that are ideally found in a passivation layer regardless of the type of semiconductor device to which the layer is applied. The desired properties include, for example, good moisture barrier, controlled stress so as not to impart an undesired mechanical stress to the underlying device, stable film quality under environmental changes, and good mechanical strength and hardness. In addition, the passivation layer must be capable of being processed in accordance with reasonable photo lithographic processes so that contact holes can be opened through the layer.

Some semiconductor devices place additional requirements on the final passivation layer. For example, for flash memory or other non-volatile memory technologies, the passivation layer must be UV light transparent so that the device can be erased using ultraviolet light. Even electrically alterable non-volatile memory devices are usually erased, at least initially, using UV light. The concentration of silicon-hydrogen bonds in the layer should also be as low as possible for such devices because such bonds are considered to cause reliability problems for memory devices.

There is a seemingly unending trend in the semiconductor industry to scale down device dimensions. As part of this trend the spacing between adjacent metal lines continues to decrease while the thickness of the metal line tends to remain the same or at least not to decrease proportionally with the spacing. This results in a narrowing gap between metal lines, with the gap having a large aspect ratio that is difficult to fill completely by using conventional chemical vapor deposition (CVD) or plasma enhanced chemical vapor deposition (PECVD) film deposition techniques. If the gaps are not filled completely, however, residue from subsequent steps may be trapped in resulting voids causing device instability and/or device failure.

In the past, passivation layers have been achieved by depositing a thick two layer film structure by PECVD. The first layer has been a layer of silicon oxide and the second, overlying layer, has been a layer of silicon nitride. In this prior art structure the silicon nitride was used because it provides a much harder surface than does PECVD oxide. In addition to the problem of void formation, the prior art film has been unsatisfactory as a passivation layer in memory devices because silicon nitride has a low transparency for UV light and because silicon nitride contains a high concentration of silicon-hydrogen bonds.

Thus it is apparent that a need existed for an improved final passivation layer, especially for flash memory and other non-volatile memory technologies, that would overcome the problems attendant with the prior art passivation layers. A need also existed for an improved semiconductor device utilizing such a final passivation layer and for a process for fabricating such passivation layer and semiconductor device.

DETAILED DESCRIPTION OF PREFERRED EMBODIMENTS

Figure 1:
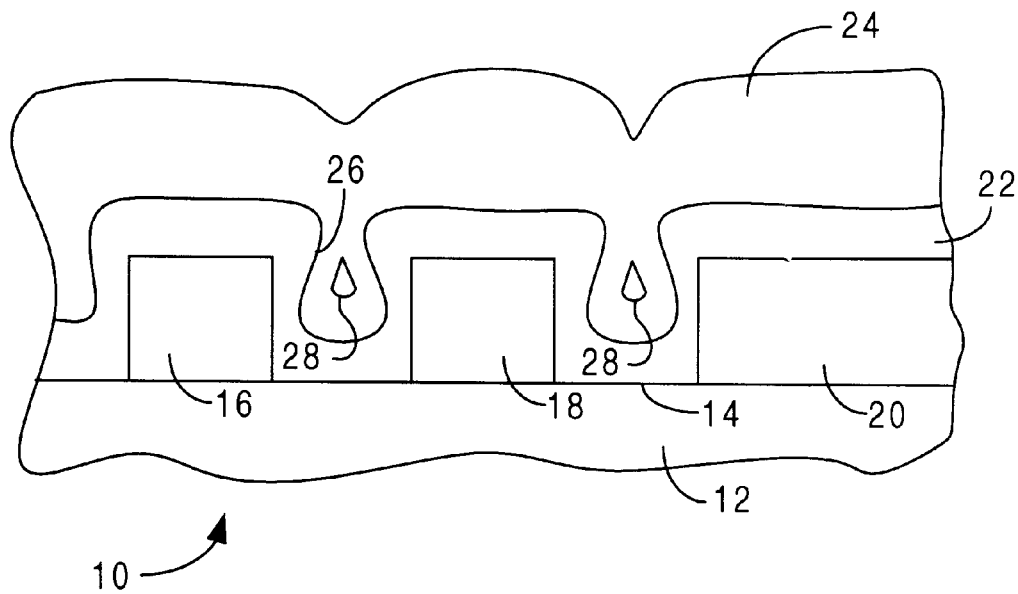
FIG. 1 shows, in cross-section, a portion of a semiconductor device illustrating the void problem with prior art structures.

FIG. 1 illustrates, in cross-section, a portion of a semiconductor device 10 fabricated in accordance with a prior art process. Device 10 includes a semiconductor substrate 12 which can include, for example, a silicon wafer in which doped regions have been formed to provide the various regions of active semiconductor devices, and upon which various insulator and conductor layers have been formed. All of the aforementioned regions and layers are well known in the art for forming discrete or integrated device structures and need not be shown or described herein. The top surface 14 of substrate 12 can include an insulating layer through which openings (not shown) have been formed to expose underlying device regions and electrodes. Overlying surface 14 a layer of metallization has been deposited and selectively patterned to, form metal structures 16, 18, 20. The metal structures can be used to form device electrodes and bonding pads, or to interconnect the different parts of the device or integrated circuit structure. The metallization deposited on the surface 14 and hence the metal structures usually have the thickness of a few hundred nm and preferably have a thickness of about 800 to 1000 nm. Although the device is completed after the metal structures are formed in the sense that the device can now be a fully-operating semiconductor device, it is conventional to form a passivation layer overlying the metal structures to provide protection for the device and especially for the metal structures.

As device complexity increases and device operating speeds increase, device sizes shrink. Typically this results in a decrease in the gap between adjacent metal structures such as between structures 16 and 18. This decrease in gap size is often done without a commensurate reduction in the thickness of the metal structures. Thus the aspect ratio, that is, the ratio of the height of the metal compared to the width of the gap, increases. As the aspect ratio increases it becomes ever more difficult to cover the metal structures in a reliable manner. This problem is illustrated in FIG. 1 wherein a prior art two level passivation coating has been applied. Conventional prior art passivation includes a first layer 22 of oxide and a second layer 24 of silicon nitride. Both layers can be deposited by chemical vapor deposition or by plasma enhanced chemical vapor deposition. The deposition of oxide layer 22 does not result in a conformal film of uniform thickness. Instead, the kinetics of the CVD or PECVD process results in a thinning of the oxide layer on the vertical edges of the metal structure and a resulting negative slope as illustrated, for example, at 26. The negative slope 26 makes it difficult, if not impossible, to cover the structure with a second layer 24 without leaving voids in the overlying layer such as those illustrated at 28. Voids 28 can lead to lack of reliability in the finished device because the voids can trap water, acids, or other contaminants.

Figure 2:
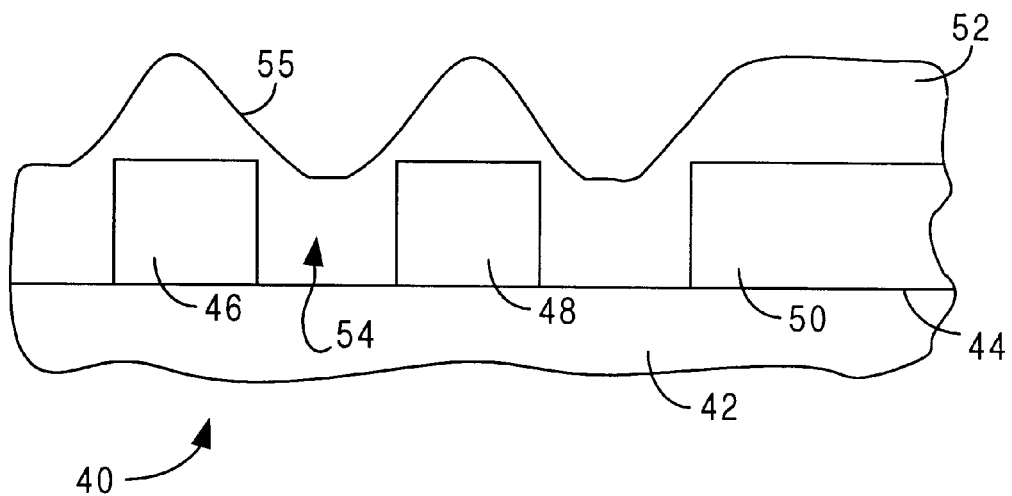
FIGS. 2–4 illustrate, in cross-section, process steps for fabricating a semiconductor device in accordance with the invention.
Figure 3:
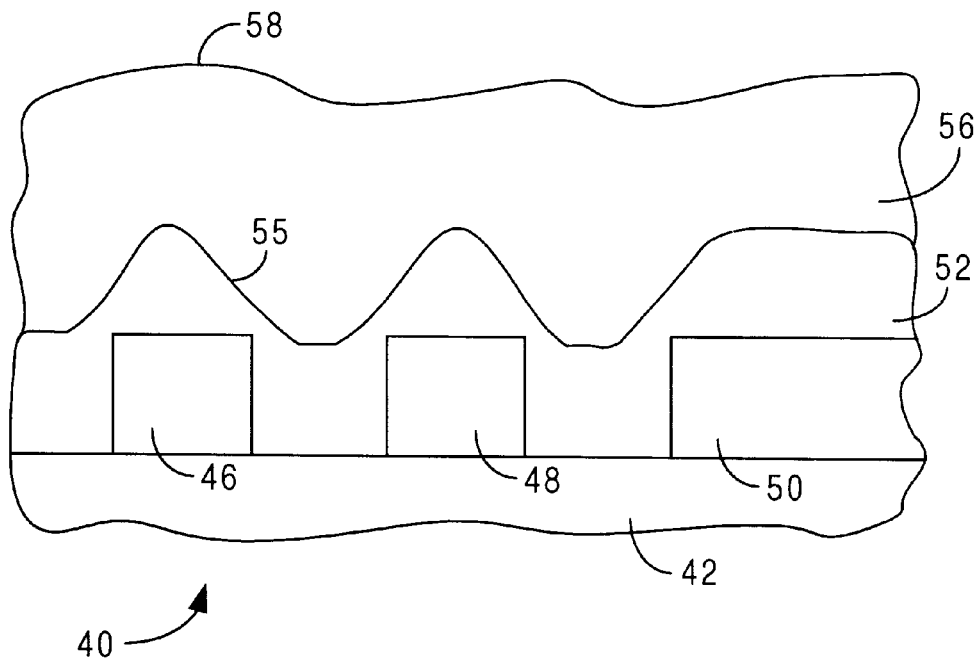
Figure 4:
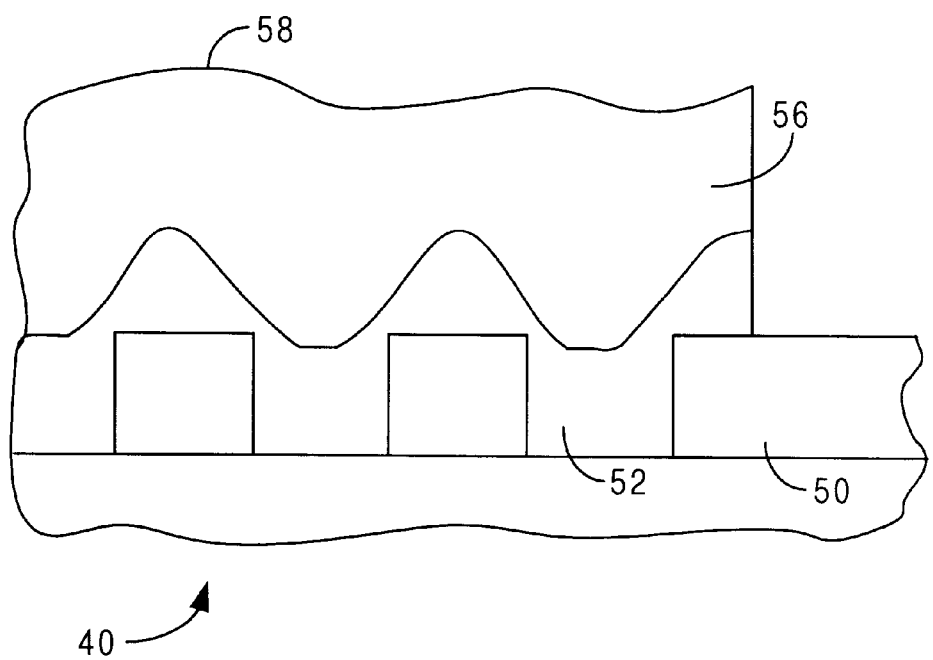

FIGS. 2–4 illustrate process steps in accordance with the invention which overcome deficiencies in the prior art process and structure. FIG. 2 illustrates, in cross-section, a portion of a semiconductor device 40 fabricated in accordance with the invention. Device 40 include a substrate 42, the details of which are not illustrated as they are well known in the semiconductor art. Substrate 42 can include, for example, a semiconductor wafer in which doped device regions have been formed, layers of insulation overlying the semiconductor wafer and appropriately patterned, and layers of conductor material, again appropriately patterned to form device regions, electrodes, and interconnections. If device 40 is a flash memory or other non-volatile memory device, fabricated in MOS technology, for example, substrate 42 would include a silicon substrate wafer, doped source and drain regions, gate insulators, polycrystalline silicon floating gate electrodes, interlayer dielectrics, and the like. These elements of the device structure are well known and need not be further described. The top surface 44 of substrate 42 can be the top surface of an insulating layer. Openings (not shown) through the insulating layer provide access to underlying device regions, electrodes, and interconnections. A layer of metal is deposited on surface 44 and patterned to form metal structures 46, 48, 50. The metal deposited on surface 44 can be aluminum, an aluminum alloy, copper, or other suitable electrically conductive material. The metal structures 46, 48, 50 form device electrodes, interconnections, and bonding pads. Contact is made between the metal structures and the underlying device through openings (not shown) in the insulating layer at the top of substrate 42 as is necessary to implement the desired device or integrated circuit function.

In accordance with the invention, a first layer 52 of insulating material is deposited overlying the metal structures. One objective of insulating layer 52 is to fill or substantially fill the gaps between the metal structures such as the gap 54 between metal structure 46 and metal structure 48 in such a manner that a subsequent layer can be deposited over layer 52 in a void free manner. In accordance with a preferred embodiment of the invention layer 52 is a high density plasma (HDP) oxide. As is well known, HDP oxides are formed by a procedure that involves competing etching and deposition processes. The end result of an HDP oxide deposition is a film, as illustrated, without a negative slope as the oxide passes over the edge of an underlying structure. Instead of forming an overhanging portion at the edge of the underlying structure, the region where the overhanging portion might be formed is continuously etched during the deposition process to yield a favorable and easily covered surface 55 on insulator layer 52.

FIG. 3 illustrates, again in cross-section, continuing steps in accordance with the invention for the fabrication of device 40. A second insulating layer 56 is deposited over surface 55 of insulating layer 52. Insulating layer 56 is a layer of silicon oxynitride preferably deposited by plasma enhanced chemical vapor deposition. Layer 56 is deposited to have a number of desired characteristics. Layer 56 is a void free insulator having an upper surface 58 that is sufficiently planar to facilitate a subsequent photo lithographic patterning step. Layer 56 should have a hard surface to provide physical or mechanical protection for the underlying device. Especially if device 40 is a flash memory or other form of floating gate non-volatile memory, layer 56 should also be UV transparent. Silicon oxynitride satisfies the criteria for both hardness and UV transparency. Although silicon nitride provides the requisite hard surface, it is not sufficiently UV transparent.

In order to achieve the desired void free film 56, film 52 should be of sufficient thickness to provide the base upon which the void free film 56 can be deposited. Preferably HDP oxide layer 52 has a minimum thickness equal to about 90 to 95% of the thickness of the underlying metal structures. For a metal structure thickness of about 850 to 900 nm, an HDP oxide layer thickness of about 800 nm is preferred. It is also preferred that layer 56 have a nominal thickness approximately equal to the thickness of the underlying HDP oxide layer. Thus a silicon oxynitride layer having a thickness of about 800 nm is preferred. The combined thickness of the two layers provides the desired surface 58 of silicon oxynitride layer 56 and the two layers together can be easily patterned as required in the subsequent processing step.

The silicon oxynitride layer 56 is preferably deposited by plasma enhanced chemical vapor deposition using reactants $SiH_4$, $N_2O$, and $NH_3$. This can be done, for example, in the Concept 2 system available from Novellus. Preferred operating conditions in that equipment to achieve the desired passivation layer are $SiH_4$ 250 sccm, $N_2O$ 2500 sccm, $NH_3$ 2500 sccm and $N_2$ 6000 sccm. The deposition is preferably done at a temperature of about 400° C., a pressure of 1.9 Torr, with the high frequency RF equal to 350 watts and the low frequency RF equal to 650 watts. Such deposition conditions result in a silicon oxynitride film having a refractive index between about 1.6 and 1.8 and preferably about 1.685. Such a layer is almost 100% transparent to UV light.

Processing of the semiconductor device 40 is completed at the wafer level by forming openings through the passivation layer at desired locations as illustrated in FIG. 4. A layer of photoresist (not shown) is applied to surface 58 of silicon oxynitride layer 56. The photoresist layer is selectively patterned as is well known in the photo lithographic art and the resulting patterned photoresist is used as an etch mask to selectively etch through layers 52 and 56 of the passivation coating. As illustrated in FIG. 4, the two layers are selectively removed to expose a portion of metal structure 50 which may be, for example, a bonding pad to which a lead will subsequently be attached. This completes the fabrication of the semiconductor device at the wafer level in accordance with the invention. Subsequent back end processing such as testing, dicing, and packaging are well known in the art and will not be described.

Thus it is apparent that there has been provided, in accordance with the invention, a semiconductor device and a method for its fabrication which overcomes the shortcomings of the prior art process and structure. Although the invention has been described and illustrated with reference to specific embodiments thereof, it is not intended that the invention be limited to these illustrative examples. Although the invention is most advantageously applied to non-volatile memory devices having a floating gate which is erased by illumination with UV light at least once during the lifetime of the device, the invention may also be applied to other semiconductor device types.

What is claimed is:

1. A process for fabricating a semiconductor device comprising the steps of:

providing a semiconductor substrate;

forming a pattern of metal lines overlying the substrate, the metal lines having a thickness and adjacent metal lines being separated by a gap;

depositing a layer of HDP oxide overlying the pattern of metal lines, covering the metal lines, and substantially filling the gap;

depositing a layer of PECVD silicon oxynitride overlying the layer of HDP oxide; and patterning the layer of silicon oxynitride to form openings therethrough selectively exposing portions of the pattern of metal lines.

2. The process of claim 1 wherein the layer of HDP oxide is deposited to a minimum thickness of about 90 to 95 percent of the thickness of metal lines.

3. The process of claim 1 wherein the layer of PECVD silicon oxynitride is deposited from reactants $SiH_4$, $N_2O$, and $NH_3$.

4. A process for fabricating a semiconductor device comprising the steps of:

provaiding a semiconductor substrate;

forming a plurality of metal structures overlying the substrate, the metal structures characterized by a thickness, adjacent ones of the plurality of metal structures being separated by a gap;

depositing a first HDP layer of sufficient thickness to substantially fill the gap, the first HDP layer overlying and covering the plurality of metal structures; and depositing a second hard, UV transparent layer overlying the first HDP layer.

5. The process of claim 4 wherein the step of depositing a second hard, UV transparent layer comprises depositing a layer of silicon oxynitride.

6. The process of claim 4 wherein the step of depositing a second hard, UV transparent layer comprises depositing a layer of silicon oxynitride by plasma enhanced chemical vapor deposition.

7. The process of claim 4 wherein said step of depositing a first HDP layer comprises the step of depositing a layer of HDP oxide having a thickness equal to about 90–95% of the thickness of the metal structures.

8. The process of claim 1, wherein the process is used for fabricating a memory device that is erasable by UV light.

9. The process of claim 1, wherein the HDP oxide has no voids.

10. The process of claim 1, wherein the substrate is comprised of a plurality of positively or negatively doped regions or a dielectric layer.

11. The process of claim 1, wherein the HDP oxide has an approximate thickness of 800 nm, when the thickness of the metal layer is between 850–900 nm.

12. The process of claim 11, wherein the layer of silicon oxynitride has an approximate thickness of 800 nm, when the thickness of the metal layer is between 800–900 nm.

13. The process of claim 1, wherein the metal is selected from the group consisting of aluminum, aluminum alloy and copper.

14. The process of claim 4, wherein the process is used for fabricating a memory device that is erasable by UV light.

15. The process of claim 4, wherein the HDP layer has no voids.

16. The process of claim 4, wherein the substrate is comprised of a plurality of positively or negatively doped regions or a dielectric layer.

17. The process of claim 4, wherein the HDP layer has an approximate thickness of 800 nm, when the thickness of the metal layer is between 800–900 nm.

18. The process of claim 17, wherein the second hard, UV transparent layer has an approximate thickness of 800 nm, when the thickness of the metal layer is between 800–900 nm.

19. The process of claim 4, wherein the metal is selected from the group consisting of aluminum, aluminum alloy and copper.

20. A method for fabricating a semiconductor device comprising:

forming a semiconductor substrate with a plurality of devices in the substrate;

depositing a first metal layer having a thickness over the substrate;

etching the first metal layer such that a plurality of metal lines are formed having a width and having a plurality of gaps between the metal lines;

performing an HDP process to deposit an HDP oxide layer over the metal lines and the substrate, the HDP oxide substantially filling the plurality of gaps; and forming a hard protective layer over the HDP oxide layer using a PECVD process.

21. The method of claim 20, wherein the method further comprises:

etching the hard protective layer and the HDP oxide layer, selectively exposing the metal lines;

depositing a second metal layer over the hard protective layer; and etching the second metal layer selectively, forming interconnects between the metal lines of the first metal layer.

22. The method of claim 20, wherein the hard protective layer is comprised of a UV transparent material.

23. The method of claim 22, wherein the hard protective layer is silicon oxynitride.

24. The method of claim 20, wherein the thickness of the HDP oxide is approximately 90–95% of the thickness of the first metal layer.

25. The method of claim 20, wherein the thickness of the hard protective layer is approximately 90–95% of the thickness of the first metal layer.

26. The method of claim 20, wherein the process is used for fabricating a memory device that is erasable by UV light.

27. The method of claim 20, wherein the metal is selected from the group consisting of aluminum, aluminum alloy and copper.

28. A method for fabricating a semiconductor device comprising the steps of:

providing a substrate;

forming a metal layer over the substrate;

etching the metal layer to produce a plurality of metal lines on the substrate, leaving a plurality of metal layer gaps between the metal lines;

filling said plurality of metal layer gaps using a high density plasma oxide process, leaving a plurality of high density plasma oxide layer gaps; and filling said plurality of high density plasma oxide layer gaps using a plasma enhanced chemical vapor deposition process, leaving a substantially planar surface.

29. The method of claim 28, wherein the method further comprises:

etching a plasma enhanced chemical vapor deposited layer and a high density plasma oxide layer, selectively exposing the metal lines;

depositing a second-metal layer over the plasma enhanced chemical vapor deposition layer; and etching the second metal layer selectively to form interconnects between the metal lines of the first metal layer.

30. The method of claim 29, wherein the plasma enhanced chemical vapor deposition process comprises plasma enhanced chemical vapor deposition of silicon oxynitride to protect and passivate the semiconductor device.

31. The method of claim 30, wherein the plasma enhanced chemical vapor deposition process is used for fabricating a memory device that is erasable by UV light.

* * * * *